United States Patent [19]

Harrison

[11] 4,320,354
[45] Mar. 16, 1982

[54] FAIL-SAFE BAND-PASS CIRCUIT

[75] Inventor: John R. Harrison, Gibsonia, Pa.

[73] Assignee: American Standard Inc., Swissvale, Pa.

[21] Appl. No.: 97,264

[22] Filed: Nov. 26, 1979

[51] Int. Cl.³ .............................................. H03F 3/04
[52] U.S. Cl. .................................... 330/306; 330/189
[58] Field of Search ............... 330/167, 175, 176, 177, 330/178, 179, 180, 185, 188, 189, 195, 196, 306, 302

[56] References Cited

U.S. PATENT DOCUMENTS

| | | | |
|---|---|---|---|
| 3,042,885 | 7/1962 | Myers | 330/178 X |
| 3,246,142 | 4/1966 | Duckitt et al. | 330/306 X |
| 3,585,519 | 6/1971 | Burgess | 330/306 |
| 3,588,533 | 6/1971 | Rhoton | 307/233 |
| 3,725,802 | 4/1973 | Darrow | 330/109 X |
| 3,890,577 | 6/1975 | Grundy | 330/302 |
| 4,001,710 | 1/1977 | Darrow | 330/109 X |

FOREIGN PATENT DOCUMENTS 2741675  1/1979  Fed. Rep. of Germany ...... 330/306

Primary Examiner—James B. Mullins
Attorney, Agent, or Firm—J. B. Sotak

[57] ABSTRACT

A vital narrow band-pass filter which operates in a fail-safe manner and includes a single stage input resonant circuit, an intermediate multistage parallel resonant circuit, and an output amplifying circuit for passing a given center carrier frequency signal and for attenuating adjacent carrier frequency signals.

9 Claims, 1 Drawing Figure

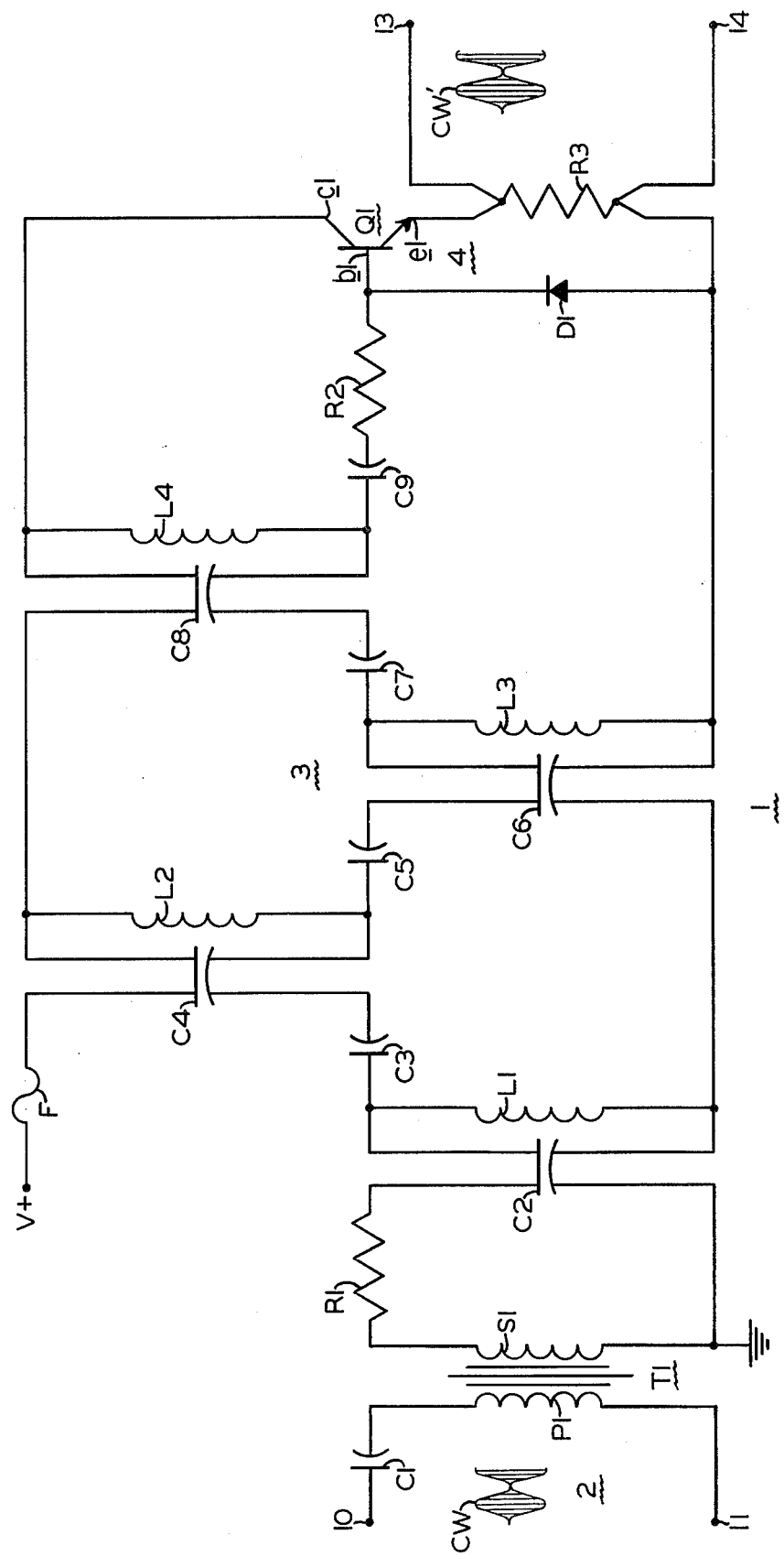

FAIL-SAFE BAND-PASS CIRCUIT

FIELD OF THE INVENTION

This invention relates to a vital filter circuit and more particularly to a fail-safe active band-pass filtering circuit employing a series tuned circuit, a parallel tuned circuit, and an amplifier for passing a signal of a given frequency and for rejecting signals of all other frequencies even during the presence of a critical component or circuit failure.

BACKGROUND OF THE INVENTION

It is well known that different kinds of filters or filtering circuits are constantly employed in various types of electronic equipment which is used in computer, telemetering, radar, radio, television, and other nonvital systems. Normally, these previous filter circuits are quite acceptable for use in such nonvital applications but are wholly unsatisfactory for employment in specific vital operations. For example, in signal and control systems for railroad and/or mass and rapid transit operations, it is essential and, in most cases, mandatory for ensuring that specific portions or circuits function in a vital or fail-safe manner. These vital circuits must not simulate a safe condition during the failure of a critical circuit component in order to provide the highest degree of safety to individuals and to minimize the chance of damage to apparatus. Thus, reliability and safety are the two most important factors in obtaining acceptance and approval for vital vehicular control systems. That is, such stringent operating requirements are necessary in order to prevent costly damage to the equipment as well as to preclude serious injury and possible death to employees and passengers. In a coded type of vehicle control system, the filtering circuit must only pass or respond to a selected center frequency or carrier signal which is transmitted into a given block or section of railroad track. Thus, the filtering circuit operates as a narrow band-pass filter which is capable of passing a preselected modulated carrier and serves to attenuate or reject spurious noise and adjacent channel carrier signals. It will be appreciated that a vital electronic filter circuit must always attenuate noise and other carrier signals even during the presence of an unsafe circuit or component failure.

OBJECTS AND SUMMARY OF THE INVENTION

Therefore, it is an object of this invention to provide a unique electronic filtering circuit which operates in a fail-safe fashion.

Another object of this invention is to provide a vital band-pass filtering circuit which rejects spurious noise and adjacent channel carrier signals even during an unsafe failure.

A further object of this invention is to provide a novel narrow band-pass filter which functions in a fail-safe manner to pass a selected center frequency signal.

Still another object of this invention is to provide a fail-safe narrow band-pass filter employing a series tuned circuit, a parallel tuned circuit, and an amplifying circuit for only passing a preselected modulated carrier.

Yet another object of this invention is to provide a fail-safe filtering circuit which passes a selected carrier frequency and which rejects spurious noise and adjacent channel carrier frequency.

Still a further object of this invention is to provide a vital narrow band-pass filter which filters all frequency signals except a center frequency signal.

Yet a further object of this invention is to provide a fail-safe band-pass filter for passing a center frequency signal and for attenuating all other frequency signals having a resonant circuit, a multistage parallel tuned circuit coupled to the resonant circuit, and an amplifying circuit coupled to the multistage parallel tuned circuit whereby a critical component or circuit failure is incapable of causing the unattenuated passage of the other frequency signals.

An additional object of this invention is to provide a vital electronic band-pass filtering circuit which is economical in cost, simple in design, reliable in operation, durable in use, and efficient in service.

In accordance with the present invention, the vital or fail-safe electronic band-pass filtering arrangement includes an input series resonant circuit. The series resonant circuit includes a coupling capacitor and a primary winding of a step-up transformer. The secondary winding of the step-up transformer is resistively coupled to a four-stage parallel tuned circuit. Each stage of the parallel tuned circuit includes an inductor and a four-terminal capacitor which are interconnected by separate coupling capacitors. An amplifying circuit is capacitively coupled to the four-stage parallel tuned circuit for amplifying signals supplied thereto. A source of d.c. operating potential is supplied to the amplifying circuit via a fuse element whereby the band-pass filtering arrangement only passes a preselected center frequency signal and attenuates all other frequency signals.

The foregoing objects and other attendant features and advantages will be more readily appreciated as the present invention becomes better understood by reference to the following detailed description when considered in conjunction with the accompanying drawing wherein:

The single FIGURE is a schematic circuit diagram of a fail-safe electronic narrow band-pass filtering circuit embodying the principles of the present invention.

Referring now to the single FIGURE of the drawing, there is shown the preferred embodiment of the vital or fail-safe band-pass filter circuit. As shown, the vital circuit which is characterized by number includes an input series filter 2, an intermediate multistage parallel filter 3, and an output amplifier 4.

It will be seen that a pair of input terminals 10 and 11 are supplied with a.c. signals which take the form of a modulated carrier CW which is received from a given section of trackway. That is, low frequency coded signals taken from the track rails of a given block or section are fed to the terminals 10 and 11. As shown, the series resonant circuit 2 includes a capacitor C1 which has one plate connected to input terminal 10. The other plate of capacitor C1 is connected to the upper end of primary winding P1 of a transformer T1 while the lower end of primary winding P1 is directly connected to input terminal 11. The inductive reactance and capacitive reactance of the primary winding P1 and capacitor C1 are chosen to be tuned to the center frequency of the preselected carrier signal CW which is applied to terminals 10 and 11. It will be appreciated that the modulated carrier signals induced in secondary winding S1 of transformer T1 are resistively coupled to the multistage parallel tuned circuit 3.

As shown, the multistage parallel resonant circuit 3 includes four capacitor and inductor networks, namely, L1-C2, L2-C4, L3-C6, and L4-C8, which provide the required attenuation of the two adjacent modulated carrier channels. The upper end of secondary winding S1 is connected to one end of a carbon composition resistor R1 while the other end of resistor R1 is connected to one terminal of the upper plate of the four-terminal capacitor C2. The lower end of secondary winding S1 and one terminal of the lower plate of the four-terminal capacitor C2 are connected to a reference potential or ground. The other terminal of the upper plate of capacitor C2 is connected to the upper end of inductor L1 while the other end of the lower plate of capacitor C2 is connected to the lower end of inductor L1. A coupling capacitor C3 couples the capacitor C2 and inductor L1 to one terminal of the lower plate of the four-terminal capacitor C4. As shown, the one terminal of the upper plate of capacitor C4 is connected to a suitable source of positive d.c. operating potential V+ via a fuse F, the function of which will be described in greater detail hereinafter. The other terminal of the upper plate of capacitor C4 is connected to the upper end of inductor L2 while the other terminal of the lower plate of capacitor C4 is connected to the lower end of inductor L2. A coupling capacitor C5 couples the capacitor C4 and inductor L2 to one terminal of the upper plate of four-terminal capacitor C6. As shown, one terminal of the lower plate of capacitor C6 is directly connected to the lower end of inductor L1 and the other terminal of the lower plate of capacitor C2. The other terminal of the upper plate of capacitor C6 is connected to the upper end of inductor L3 while the other terminal of the lower plate of capacitor C6 is connected to the lower end of inductor L3. A coupling capacitor C7 couples the capacitor C6 and inductor L3 to one terminal of the lower plate of four-terminal capacitor C8. The one terminal of the upper plate of capacitor C8 is directly connected to inductor L2 and capacitor C4. The other terminal of the upper plate of capacitor C8 is connected to the upper end of inductor L4 while the other terminal of the lower plate of capacitor C8 is connected to the lower end of inductor L4. It will be appreciated that each of the four parallel resonant circuits are tuned to the center frequency of the input carrier wave CW.

As shown, the amplifying circuit 4 includes an NPN transistor Q1 which is connected in an emitter-follower configuration. The transistor Q1 includes an emitter electrode e1, a collector electrode c1 and a base electrode b1. The collector electrode c1 is directly connected to the upper end of inductor L4 and upper plate of capacitor C8. The base electrode b1 is coupled to the lower end of inductor L4 and lower plate of capacitor C8 via the series connected capacitor C9 and carbon composition resistor R2. A diode D1 has its cathode electrode connected to the base electrode b1 of transistor Q1 and has its anode electrode connected to ground via the terminals of the lower plates of capacitors C6 and C2. The diode D1 functions to limit the reverse voltage appearing across the base-emitter junction to prevent damage to transistor Q1 and also results in symmetrical clipping of the modulated carrier signal. The emitter electrode e1 is connected to one of the upper terminals of a four-terminal resistor R3 while one of the lower terminals of the resistor R3 is connected to ground via the terminals of the lower plates of capacitors C6 and C2. As shown, the other upper and lower terminals of resistor R3 form output terminals 12 and 13, respectively, across which the amplified modulated carrier wave CW' is developed.

In describing the operation, it will be assumed that the fail-safe band-pass filter circuit is intact and operating properly and that the center frequency of the modulated carrier wave CW is applied across input terminals 10 and 11. Thus, the carrier wave CW is readily passed by the series tuned circuit 2 and also by the multistage parallel tuned circuit 3 so that an amplified carrier wave CW' is produced by amplifier 4. In practice, the adjacent carrier wave signals are attenuated by 60 to 70 db which is well below the required 35 db that is necessary to ensure safe operation. It will be seen that the failure of a critical component or circuit portion will not result in an unsafe condition. That is, under no circumstance is noise or adjacent modulated carrier signals capable of passing through the band-pass filter 1 without being greatly attenuated to the point where little, if any, output voltage can be developed across terminals 13 and 14. As mentioned above, the band-pass filter 1 will attenuate all frequency signals which are off center frequency by at least the required 35 db and in practice by 60 to 70 db. It will be seen that the opening of capacitor C1 or winding P1 interrupts the continuity of the series resonant circuit 1 so that no signal is induced into secondary winding S1 and that the short-circuiting of the capacitor C1 or winding P1 detunes the series resonant circuit 2 so that not only the center frequency carrier wave is attenuated but also the newly passed off-center frequency signal is greatly attenuated by the parallel tuned circuit 3. The opening of resistor R1 or secondary winding S1 interrupts the signal passing ability of the band-pass filter circuit 1. The shorting of the secondary winding S1 reduces the induced voltage signal level which is a safe condition. As previously mentioned, the resistor R1 is composed of a carbon composition so that there is little, if any, possibility that this resistive element will become short-circuited. The short-circuiting of the capacitors C2 and C6 results in the shunting of the input signals to ground. The opening or the loss of any one of the four leads of capacitors C2 and C6 results in the interruption of the circuit path to ground for the modulated carrier signal. The opening or shorting of the inductors L1 and L3 causes detuning so that little, if any, output is developed on terminals 13 and 14. The shorting of capacitors C4 or C8 and the shorting of inductors L2 or L4 results in no output signal being produced across terminals 13 and 14. An open circuit of these latter elements causes the input signal to be attenuated to the point where no effective output is produced. The opening of coupling capacitors C3, C5, C7, and C9 results in the interruption of the signal circuit path. The short-circuiting of capacitors C3, C5, or C7 results in the blowing of fuse F to remove operating voltage to transistor amplifier Q1 so that no output will be produced on terminals 13 and 14. The shorting of capacitor C3 causes the fuse F to blow through a circuit extending from the positive voltage terminal V+, through fuse F, through the terminals of the upper plate of capacitor C4, through inductor L2, through the terminals of the lower plate of capacitor C4, through shorted capacitor C3, through inductor L1, through the terminals of the lower plate of capacitor C2 to ground. Similarly, the shorting of capacitor C5 results in the blowing of fuse F through a circuit extending from the terminal V+, through the upper plate of capacitor C4, through inductor L2, through shorted capacitor C5, through the upper plate of capacitor C6, through inductor L3, through the lower plate of capacitor C6, through the lower plate of capacitor C2 to ground. Likewise, the shorting of capacitor C7 causes the fuse F to blow through a circuit extending from terminal V+, through the upper plate of capacitor C4, through the upper plate of capacitor C8, through inductor L4, through the lower plate of capacitor C8, through shorted capacitor C7, through inductor L3, and through the lower plates of capacitors C6 and C2 to ground. The opening of resistor R2 results in removal of the input carrier wave signal to amplifier 4 while the resistor R2 will not short due to its special construction of carbon composition. The failure of diode D1 is not a critical condition. The opening or shorting of transistor Q1 destroys the amplifying qualities of the amplifier 4. The shorting between the base-emitter junction is made safe due to the selection of the resistance value of resistor R3 in comparison to R2. In practice, the resistor R2 is extremely large in comparison to resistor R3, approximately 100 to 1, so that most of the voltage drop is across resistor R2 and very little across load resistor R3. The four-terminal resistor R3 is inherently a fail-safe element which ensures that the resistance cannot increase due to a poor solder connection. Thus, it will be appreciated that the presently described band-pass filtering circuit operates in a fail-safe manner in that no critical component or circuit failure is capable of producing an erroneous output.

It will be appreciated that while the subject invention finds particular utility in signal and control systems for railroad and mass and/or rapid transit operation it is apparent that the invention may be used in other types of systems, equipment, and apparatus.

In addition, it will be understood that various changes, modifications, ramifications, and alternations may be employed without departing from the spirit and scope of the present invention. For example, the input filter 2 may be a parallel resonant circuit rather than a series tuned circuit. The configuration of the amplifier 4 may be other than an emitterfollower. The NPN transistor may be replaced by a PNP transistor by changing the polarity of the voltage V+ and diode D1. Further, the number of the parallel resonant circuits may be greater or lesser than the four networks shown depending on the degree of attenuation or rejection that is required for any given application. Thus, it is apparent that other changes and modifications may be made by one skilled in the art and, therefore, it is understood that all alternations, equivalents, and ramifications falling within the spirit and scope of the present invention are herein meant to be included in the appended claims.

Having now described the invention what I claim as new and desire to secure by Letters Patent, is:

1. A fail-safe band-pass filter for passing a center frequency signal and for attenuating all other frequency signals comprising, a resonant circuit including a series-connected capacitor and an inductive winding for passing said center frequency signal, a multistage parallel tuned circuit coupled to said resonant circuit, and an amplifying circuit coupled to said multistage parallel tuned circuit whereby a critical component or circuit failure is incapable of causing the unattenuated passage of the other frequency signals.

2. The fail-safe band-pass filter as defined in claim 1, wherein said inductive winding is a primary winding of a transformer.

3. The fail-safe band-pass filter as defined in claim 2, wherein a secondary winding of said transformer is resistively connected to said multistage parallel tuned circuit.

4. The fail-safe band-pass filter as defined in claim 1, wherein said multistage parallel tuned circuit supplies d.c. operating potential to said amplifying circuit.

5. The fail-safe band-pass filter as defined in claim 1, wherein said multistage parallel tuned circuit includes four parallel coupled inductive-capacitor networks.

6. The fail-safe band-pass filter as defined in claim 1, wherein said resonant circuit is transformer-coupled to said multistage parallel tuned circuit.

7. A fail-safe band-pass filter for passing a center frequency signal and for attenuating all other frequency signals comprising, a resonant circuit, a multistage parallel tuned circuit coupled to said resonant circuit, each of said multistage parallel tuned circuits includes a four-terminal capacitor and an inductor, and an amplifying circuit coupled to said multistage parallel tuned circuit whereby a critical component or circuit failure is incapable of causing the unattenuated passage of the other frequency signals.

8. The fail-safe band-pass filter as defined in claim 7, wherein a separate coupling capacitor interconnects each stage of said multistage parallel tuned circuit.

9. The fail-safe band-pass filter as defined in claim 8, wherein a fuse is interposed between the d.c. operating potential and said amplifying circuit.

* * * * *